United States Patent
Yi et al.

(10) Patent No.: US 11,856,771 B2
(45) Date of Patent: Dec. 26, 2023

(54) METHOD OF FORMING SILICON-OXIDE-NITRIDE-OXIDE-SILICON (SONOS) MEMORY CELL FOR FINFET

(71) Applicant: UNITED MICROELECTRONICS CORP., Hsin-Chu (TW)

(72) Inventors: Liang Yi, Singapore (SG); Zhiguo Li, Singapore (SG); Chi Ren, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/864,435

(22) Filed: Jul. 14, 2022

(65) Prior Publication Data
US 2022/0352195 A1    Nov. 3, 2022

Related U.S. Application Data

(62) Division of application No. 17/224,100, filed on Apr. 6, 2021.

(30) Foreign Application Priority Data

Mar. 11, 2021 (CN) .......................... 202110266360.6

(51) Int. Cl.
*H10B 43/20*    (2023.01)
*H01L 29/78*    (2006.01)
(Continued)

(52) U.S. Cl.
CPC ....... *H10B 43/20* (2023.02); *H01L 29/66795* (2013.01); *H01L 29/7851* (2013.01); *H10B 41/20* (2023.02)

(58) Field of Classification Search
CPC ......... H01L 27/11578; H01L 27/11551; H01L 29/66795; H01L 29/7851; H01L 29/40117; H01L 29/4234; H01L 29/66833; H01L 29/792; H01L 27/11573; H01L 29/785; H01L 27/11568; H10B 43/20; H10B 41/20; H10B 43/40; H10B 43/30
See application file for complete search history.

(56) References Cited

U.S. PATENT DOCUMENTS 7,589,387 B2    9/2009   Hwang
8,710,578 B2    4/2014   Jenne
(Continued)

*Primary Examiner* — Shahed Ahmed
*Assistant Examiner* — Khatib A Rahman
(74) *Attorney, Agent, or Firm* — Winston Hsu

(57) ABSTRACT

A silicon-oxide-nitride-oxide-silicon (SONOS) memory cell for FinFET includes a fin, a control gate and a selective metal gate. The fin is on a top surface of a substrate, wherein the fin has two sidewalls and a top surface, and the fin includes a memory region and a logic region. The control gate is disposed over the fin of the memory region and covers the two sidewalls and the top surface of the fin, wherein the control gate includes a charge trapping layer and a control electrode, wherein the charge trapping layer is sandwiched by the fin and the control electrode. The selective metal gate is disposed over the fin adjacent to the control gate and covers the two sidewalls and the top surface of the fin. The present invention also provides a method of forming said silicon-oxide-nitride-oxide-silicon (SONOS) memory cell.

12 Claims, 7 Drawing Sheets

(51) Int. Cl.
*H01L 29/66* (2006.01)
*H10B 41/20* (2023.01)

(56) References Cited

U.S. PATENT DOCUMENTS

| | | | |
|---|---|---|---|
| 8,803,223 B2 | 8/2014 | Lin | |
| 8,932,925 B1 * | 1/2015 | Hong | H10B 41/47 |
| | | | 438/267 |
| 9,583,499 B1 * | 2/2017 | Zhu | H01L 21/32139 |
| 9,853,039 B1 * | 12/2017 | Kang | H10B 41/10 |
| 9,899,538 B1 | 2/2018 | Chang | |
| 10,332,884 B2 * | 6/2019 | Yi | H01L 29/66795 |
| 10,784,270 B2 * | 9/2020 | Lin | H01L 29/6656 |
| 10,903,366 B1 * | 1/2021 | Chen | H01L 29/792 |
| 10,937,794 B2 | 3/2021 | Zhou | |
| 11,621,271 B2 * | 4/2023 | Hsu | H01L 29/66833 |
| | | | 257/324 |
| 2007/0076477 A1 | 4/2007 | Hwang | |
| 2007/0108504 A1 * | 5/2007 | Lee | H10B 43/30 |
| | | | 438/257 |
| 2012/0235224 A1 | 9/2012 | Yeh | |
| 2015/0060989 A1 * | 3/2015 | Loiko | H01L 29/40117 |
| | | | 438/587 |
| 2016/0284702 A1 * | 9/2016 | Park | H01L 29/66795 |
| 2017/0194344 A1 * | 7/2017 | Wu | H10B 43/35 |
| 2018/0145085 A1 * | 5/2018 | Liu | H01L 29/42328 |
| 2021/0305264 A1 | 9/2021 | Zhou | |
| 2022/0231037 A1 | 7/2022 | Jourba | |

* cited by examiner

METHOD OF FORMING SILICON-OXIDE-NITRIDE-OXIDE-SILICON (SONOS) MEMORY CELL FOR FINFET

CROSS REFERENCE TO RELATED APPLICATIONS

This application is a division of U.S. Application No. 17,224, 100, filed on Apr. 6, 2021. The content of the application is incorporated herein by reference.

BACKGROUND OF THE INVENTION

1. Field of the Invention

The present invention relates generally to a silicon-oxide-nitride-oxide-silicon (SONOS) memory cell and forming method thereof, and more specifically to a silicon-oxide-nitride-oxide-silicon (SONOS) memory cell for FinFET and forming method thereof.

2. Description of the Prior Art

Memory is divided into two categories: volatile memory and non-volatile memory. In nowadays, the two important types of volatile memory are static random access memory (SRAM) and dynamic random access memory (DRAM). There are many types of non-volatile memory. Flash memory is the most popular type, and other types may include silicon-oxide-nitride-oxide-silicon (SONOS), ferroelectric random access memory (FRAM), phase-change random access memory (PRAM), magnetoresistive access memory (MRAM) and resistive random access memory (RRAM).

SUMMARY OF THE INVENTION

The present invention provides a silicon-oxide-nitride-oxide-silicon (SONOS) memory cell for FinFET and forming method thereof, which forms a control gate in a memory region, and then forms a selective gate in the memory region and a gate in a logic region at a same time, and therefore integrates memory processes into logic processes.

The present invention provides a silicon-oxide-nitride-oxide-silicon (SONOS) memory cell for FinFET including a fin, a control gate and a selective metal gate. The fin is on a top surface of a substrate, wherein the fin has two sidewalls and a top surface, and the fin includes a memory region and a logic region. The control gate is disposed over the fin of the memory region and covers the two sidewalls and the top surface of the fin, wherein the control gate includes a charge trapping layer and a control electrode, wherein the charge trapping layer is sandwiched by the fin and the control electrode. The selective metal gate is disposed over the fin adjacent to the control gate and covers the two sidewalls and the top surface of the fin.

The present invention provides a method of forming a silicon-oxide-nitride-oxide-silicon (SONOS) memory cell for FinFET including the following steps. A fin is formed on a top surface of a substrate, wherein the fin comprises a memory region and a logic region. A charge trapping material and a control gate material are sequentially deposited to cover the fin and the substrate blanketly. The control gate material and the charge trapping material are patterned to form a charge trapping layer and a control electrode over the fin of the memory region. A dielectric layer and a gate electrode layer are sequentially deposited to cover the fin and the substrate blanketly. The gate electrode layer and the dielectric layer are patterned to form a gate in the logic region and a selective gate in the memory region adjacent to the control gate. The selective gate and the gate are replaced by a selective metal gate and a metal gate respectively.

According to the above, the present invention provides a silicon-oxide-nitride-oxide-silicon (SONOS) memory cell for FinFET and forming method thereof. The method forms a fin on a substrate of a memory region and a logic region; sequentially deposits and patterns a charge trapping material and a control gate material covering the fin and the substrate, thereby forming a control gate; sequentially deposits and patterns a dielectric layer and a gate electrode layer covering the fin and the substrate, to form a gate in the logic region and a selective gate in the memory region adjacent to the control gate; and replaces the selective gate and the gate by a selective metal gate and a metal gate respectively. Hence, memory components and logic components can be formed on the fin at a same time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
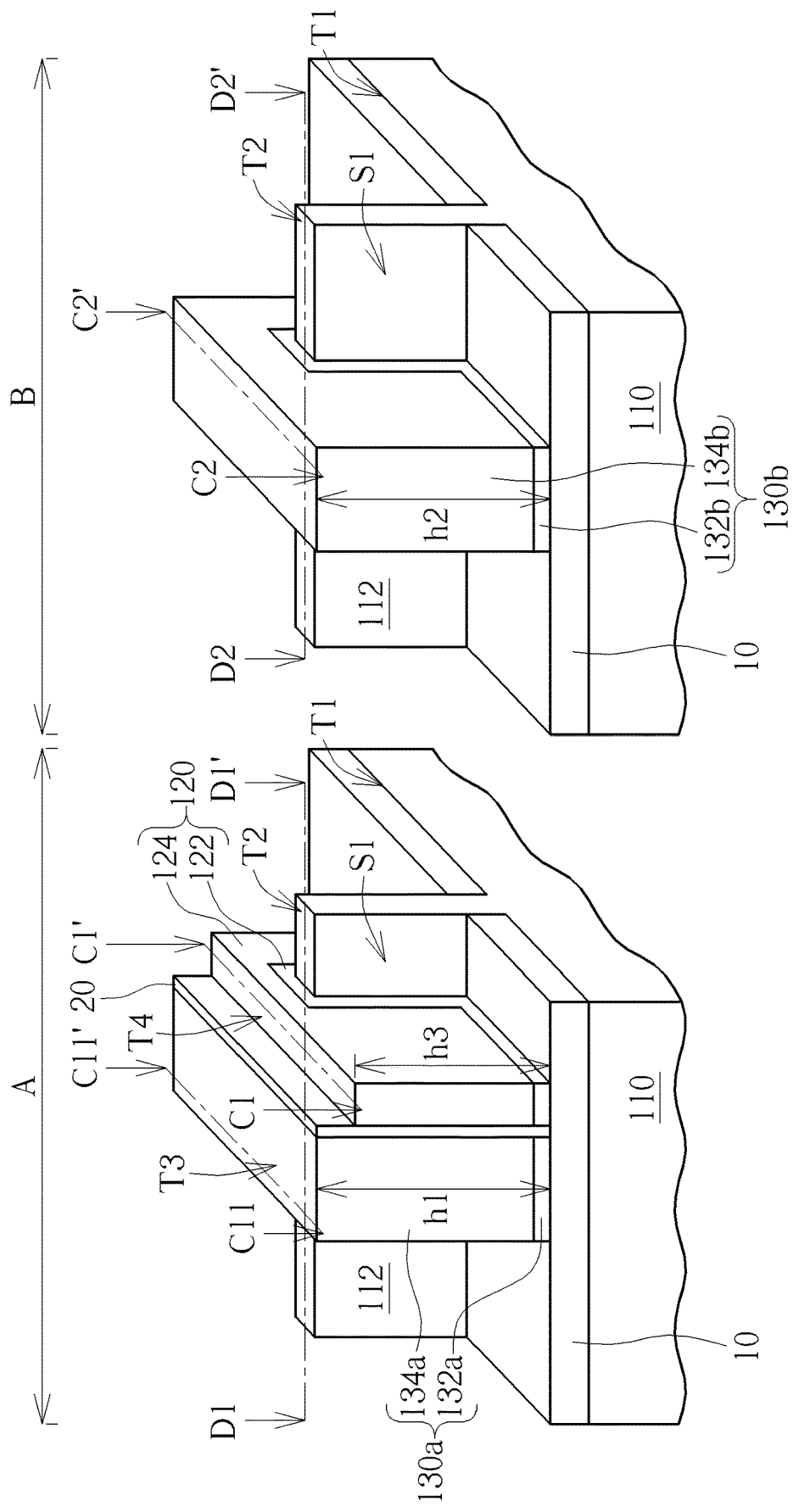
FIG. 1 schematically depicts a three-dimensional diagram of a silicon-oxide-nitride-oxide-silicon (SONOS) memory cell for FinFET according to an embodiment of the present invention.

FIG. 1 schematically depicts a three-dimensional diagram of a silicon-oxide-nitride-oxide-silicon (SONOS) memory cell for FinFET according to an embodiment of the present invention. As shown in FIG. 1, a fin 112 is located on a top surface T1 of a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The fin 112 has two sidewalls S1 and a top surface T2. In this embodiment, the fin 112 includes a memory region A and a logic region B, but it is not limited thereto. An isolation structure 10 is located on the substrate 110 beside the fin 112. The isolation structure 10 may be a shallow trench isolation (STI) structure, which is formed by a shallow trench isolation (STI) process, but it is not restricted thereto.

A control gate 120 is disposed on the fin 112 of the memory region A and covers a top surface T2 and two sidewalls S1 of the fin 112. The control gate 120 includes a charge trapping layer 122 and a control electrode 124, and the charge trapping layer 122 is sandwiched by the fin 112 and the control electrode 124. In this embodiment, the control electrode 124 may include a polysilicon electrode, and the charge trapping layer 122 may include an oxide-nitride-oxide (ONO) layer, but it is not limited thereto.

In the memory region A, a selective metal gate 130a is disposed on the fin 112 adjacent to the control gate 120, and covers the top surface T2 and the two sidewalls S1 of the fin 112. In the logic region B, a metal gate 130b is disposed on the fin 112 of the logic region B. The selective metal gate 130a and the metal gate 130b are formed by one same process and have same materials, but it is not limited thereto. In a preferred embodiment, the selective metal gate 130a and the metal gate 130b both include gate oxide layers 132a/132b and gate electrode layers 134a/134b. In a still preferred embodiment, a height h1 of the selective metal gate 130a is common to a height h2 of the metal gate 130b, to integrate memory processes into logic processes, and to simplify the formed structure.

In this case, the gate electrode layer 134a is constituted by metals such as copper or aluminum etc, and the control electrode 124 is a polysilicon electrode, and the height h1 of the selective metal gate 130a is higher than a height h3 of the control gate 120, or a top surface T3 of the selective metal gate 130a is higher than a top surface T4 of the control gate 120. Furthermore, an insulator 20 separates the selective metal gate 130a from the control gate 120, wherein the insulator 20 and the gate oxide layers 132a/132b are preferably composed of same materials, thereby the insulator 20 and the gate oxide layer 132a is one piece with a U-shape cross-sectional profile, but it is not limited thereto.

A method of forming a silicon-oxide-nitride-oxide-silicon (SONOS) memory cell for FinFET is presented as follows.

Figures 2, 3:
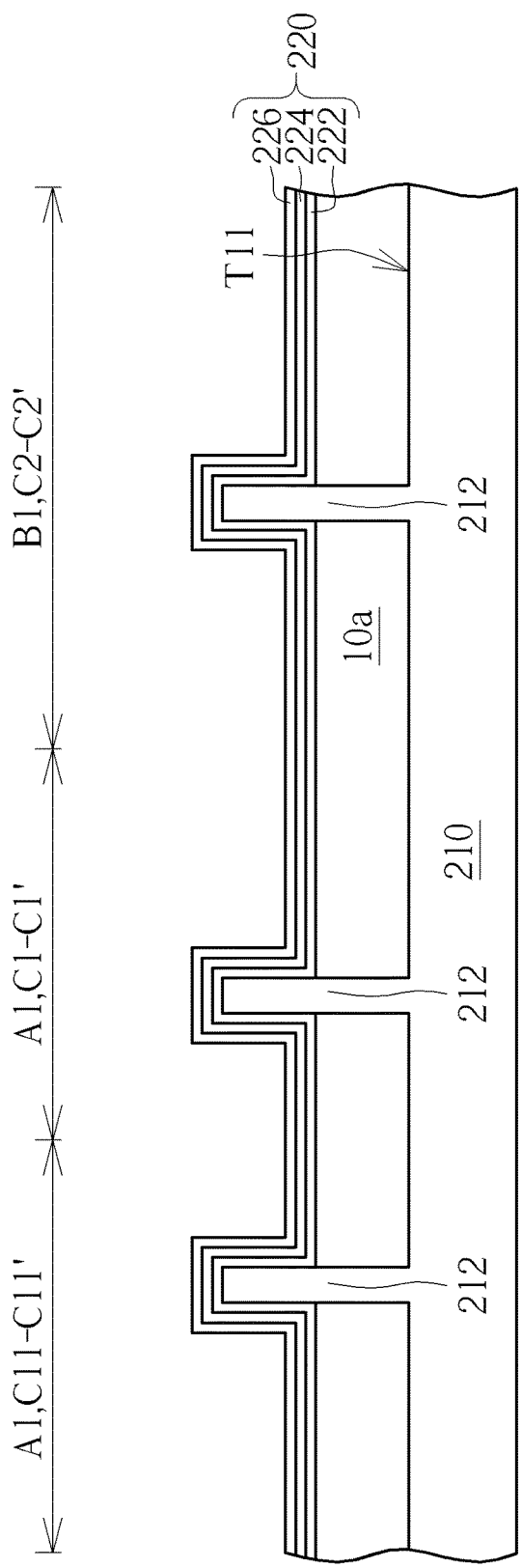
FIG. 2 schematically depicts a cross-sectional view of a method of forming a silicon-oxide-nitride-oxide-silicon (SONOS) memory cell for FinFET according to an embodiment of the present invention.
FIG. 3 schematically depicts a cross-sectional view of a method of forming a silicon-oxide-nitride-oxide-silicon (SONOS) memory cell for FinFET according to an embodiment of the present invention.

FIG. 2 to FIG. 10 schematically depict cross-sectional views of a method of forming a silicon-oxide-nitride-oxide-silicon (SONOS) memory cell for FinFET according to an embodiment of the present invention. FIG. 2 to FIG. 10 are cross-sectional views along line C1C1' of FIG. 1, line C11C11' of FIG. 1, and line C2C2' of FIG. 1. FIG. 2 to FIG. 10 include more details for illustrating the present invention clearly. As shown in FIG. 2, fins 212 are formed on a top surface T11 of a substrate 210. In this embodiment, the substrate 210 may include a memory region A1 and a logic region B1, but it is not limited thereto. Methods of forming the fins 212 may include a sidewall image transfer (SIT) method, but it is not restricted thereto. For instance, a bulk substrate (not shown) is provided, spacer patterns are formed on the bulk substrate, and the spacer patterns are transferred into the bulk substrate by etching processes, thereby the fins 212 being formed on the top surface T11 of the substrate 210. Thereafter, the spacer patterns are removed. Due to the fins 212 and the substrate 210 being formed by one single bulk substrate, the fins 212 and the substrate 210 are one piece.

Isolation structures 10a are formed on the substrate 210 between the fins 212. The isolation structures 10a may be shallow trench isolation (STI) structures, which is formed by a shallow trench isolation (STI) process, but it is not restricted thereto. More precisely, an oxide layer (not shown) may be deposited to cover the fins 212 and the substrate 210, a chemical mechanical polishing (CMP) process may be performed to remove the oxide layer higher than the fins 212, and then a wet etching process is performed to etch back the oxide layer, to form the isolation structures 10a between the fins 212.

A charge trapping layer 220 is deposited to conformally cover the fins 212 and the substrate 210. In this case, the charge trapping layer 220 is an oxide-nitride-oxide (ONO) layer including a bottom oxide layer 222, a nitride layer 224 and an oxide layer 226 stacked from bottom to top, but it is not restricted thereto.

Figure 4:
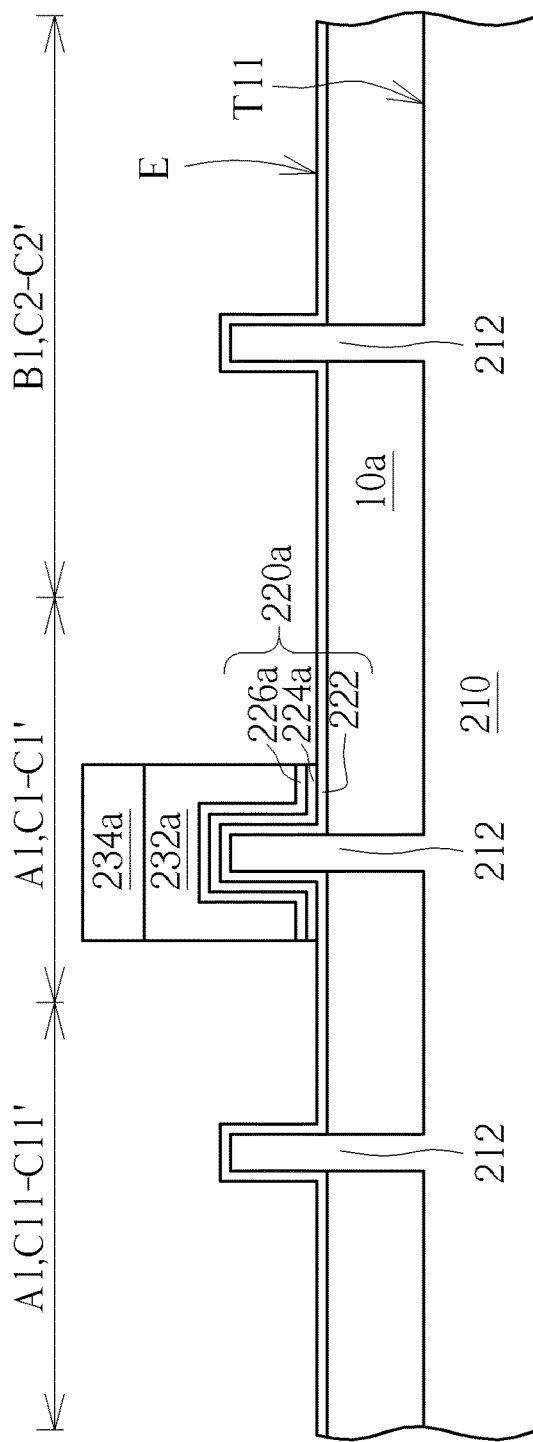
FIG. 4 schematically depicts a cross-sectional view of a method of forming a silicon-oxide-nitride-oxide-silicon (SONOS) memory cell for FinFET according to an embodiment of the present invention.

As shown in FIG. 3, a control gate material 232 and a hard mask 234 are deposited sequentially and blanketly to cover the fins 212 and the substrate 210. Then, the hard mask 234, the control gate material 232 and the charge trapping layer 220 are patterned to form a pre-charge trapping layer 220a, a control electrode 232a and a hard mask 234a on the fins 212 of the memory region A1, as shown in FIG. 4. In the patterning steps, the bottom oxide layer 222 of the charge trapping layer 220 serves as an etching stop layer, so that only the oxide layer 224 and the nitride layer 226 of the charge trapping layer 220 are etched, and the bottom oxide layer 222 is reserved to form the pre-charge trapping layer 220a.

Figure 5:
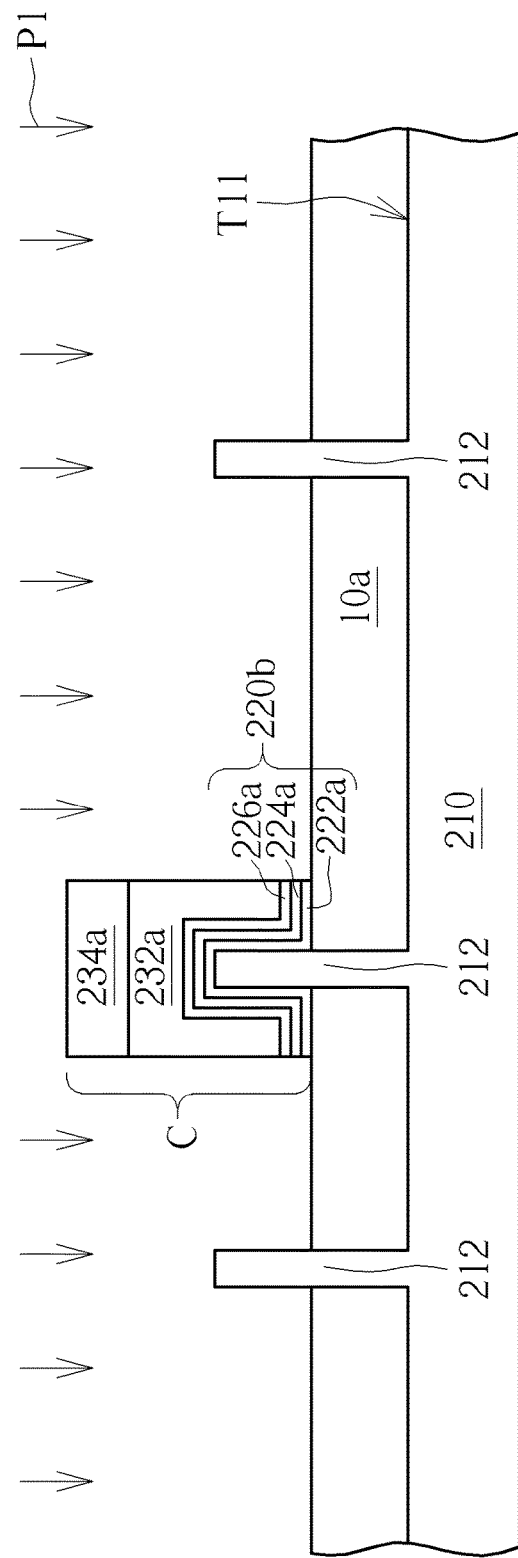
FIG. 5 schematically depicts a cross-sectional view of a method of forming a silicon-oxide-nitride-oxide-silicon (SONOS) memory cell for FinFET according to an embodiment of the present invention.

Thereafter, an oxide strip process P1 is performed to remove an exposed part E of the bottom oxide layer 222, but remain a nitride layer 226a, an oxide layer 224a and a nitride layer 222a right below the control electrode 232a to constitute a charge trapping layer 220b, as shown in FIG. 4 to FIG. 5. The charge trapping layer 220b and the control electrode 232a constitute a control gate C.

Figure 6:
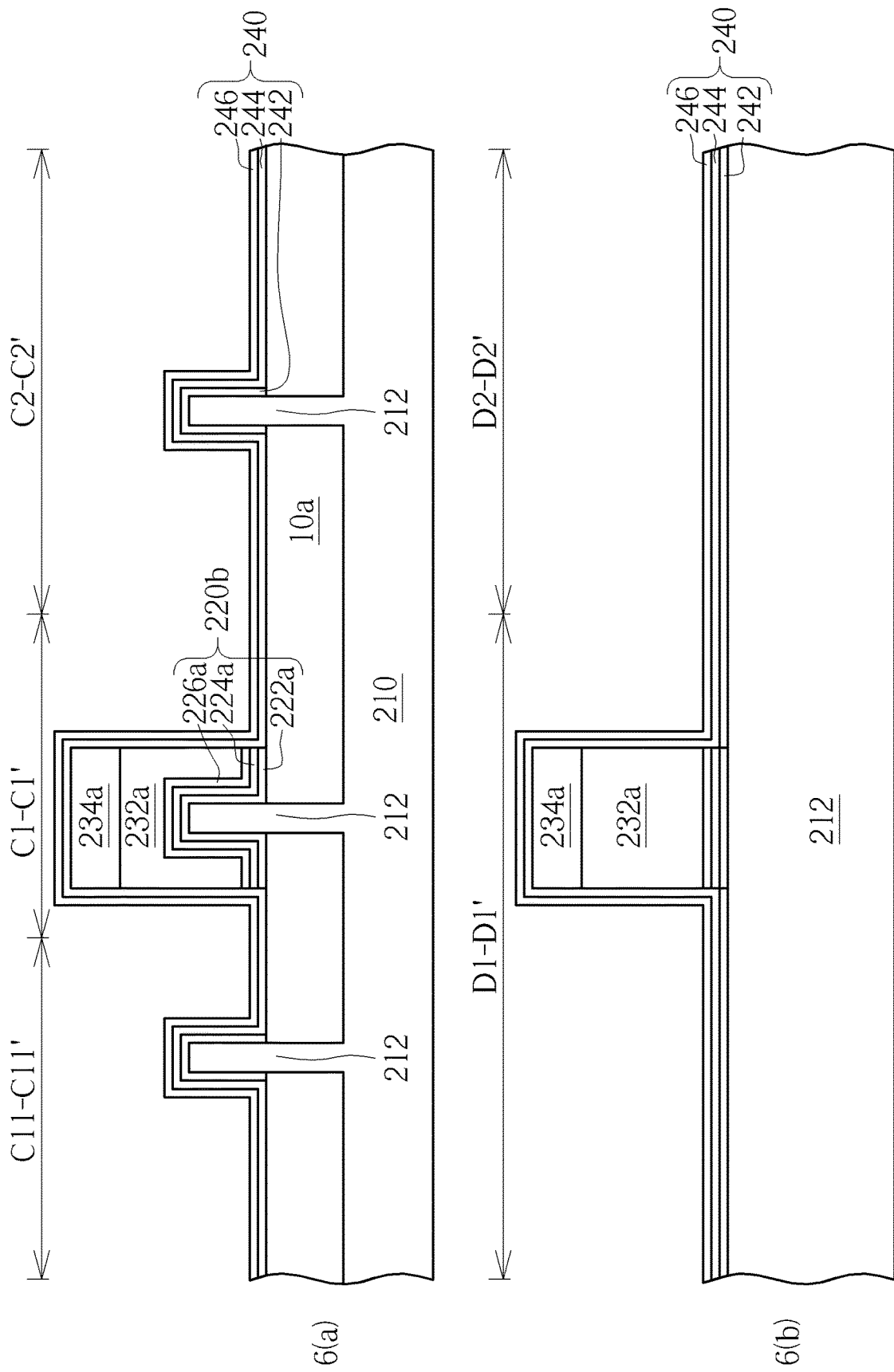
FIG. 6 schematically depicts a cross-sectional view of a method of forming a silicon-oxide-nitride-oxide-silicon (SONOS) memory cell for FinFET according to an embodiment of the present invention.

FIG. 6(a) are cross-sectional views along line C1C1' of FIG. 1, line C11C11' of FIG. 1, and line C2C2' of FIG. 1, and FIG. 6(b) are cross-sectional views along line D1D1' of FIG. 1 and line D2D2' of FIG. 1. As shown in FIG. 6, a dielectric layer 240 is deposited blanketly to cover the fins 212 and the substrate 210. The dielectric layer 240 may include a buffer layer 242, a high-k dielectric layer 244 and a selective barrier layer 246, but it is not restricted thereto. The buffer layer 242 may be an oxide layer, which may be formed by a thermal oxide process; the high-k dielectric layer 244 may include a metal containing dielectric layer, which may be hafnium oxide or zirconium oxide. The high-k dielectric layer 244 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide (HfZrO$_4$), strontium bismuth tantalite (SrBi$_2$Ta$_2$O$_9$, SBT), lead zirconate titanate (PbZr$_x$Ti$_{1-x}$O$_3$, PZT) and barium strontium titanate (Ba$_x$Sr$_{1-x}$TiO$_3$, BST). The selective barrier layer 246 may be composed of titanium (Ti), titanium nitride (TiN), tantalum (Ta) or tantalum nitride (TaN) etc.

Figure 7:
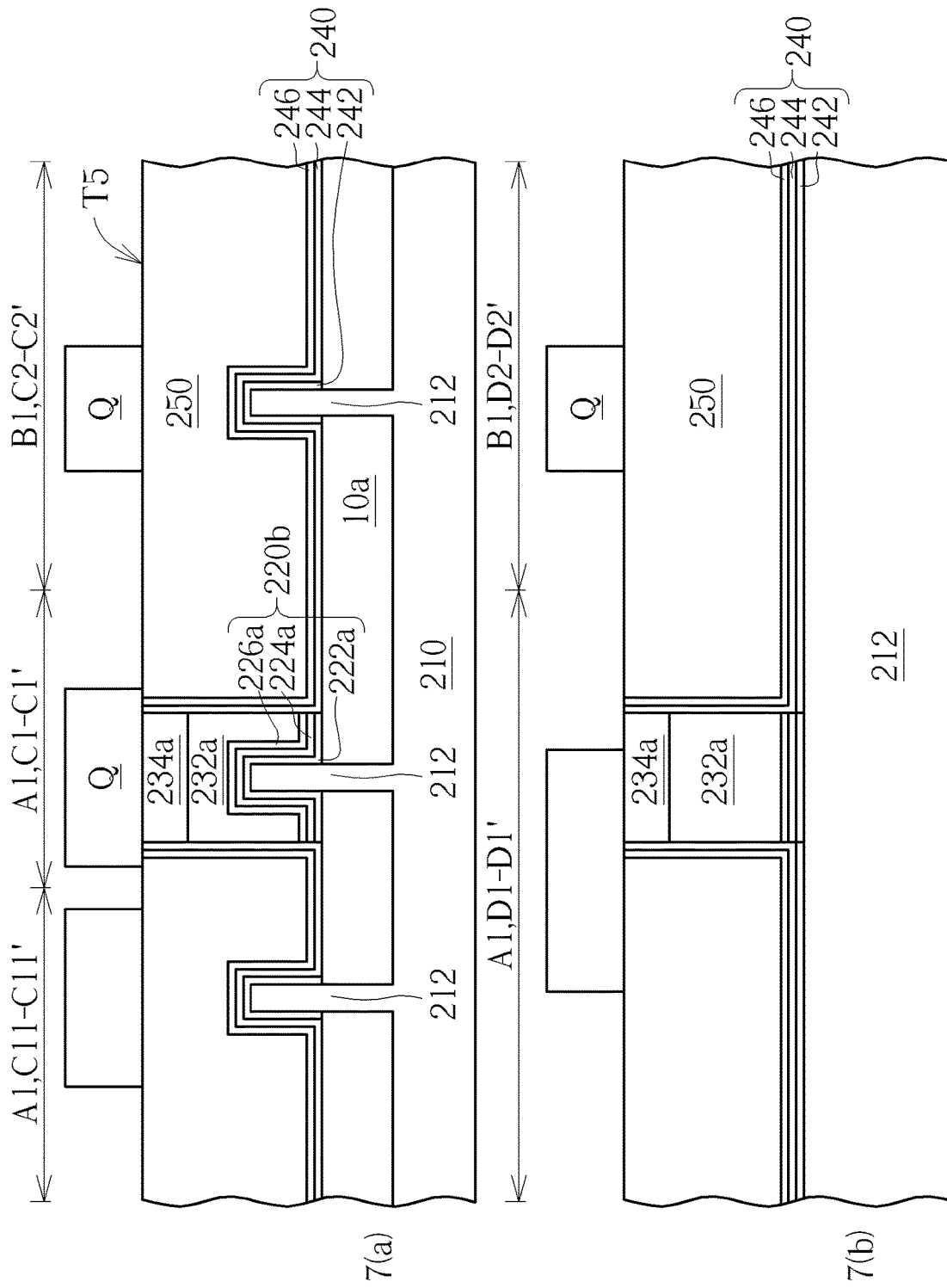
FIG. 7 schematically depicts a cross-sectional view of a method of forming a silicon-oxide-nitride-oxide-silicon (SONOS) memory cell for FinFET according to an embodiment of the present invention.

FIG. 7(a) are cross-sectional views along line C1C1' of FIG. 1, line C11C11' of FIG. 1, and line C2C2' of FIG. 1, and FIG. 7(b) are cross-sectional views along line D1D1' of FIG. 1 and line D2D2' of FIG. 1. As shown in FIG. 7, a gate electrode layer 250 is deposited blanketly to cover the dielectric layer 240 covering the fins 212 and the substrate 210. In one embodiment, methods of forming the gate electrode layer 250 may include the following. A gate electrode layer (not shown) is deposited blanketly to cover the fins 212 and the substrate 210, and then the gate electrode layer is planarized by methods such as a chemical mechanical polishing (CMP) process until the hard mask 234a is exposed to form the gate electrode layer 250 having a flat top surface T5. In one case, a part of the hard mask 234a is removed while planarizing.

Figure 8:
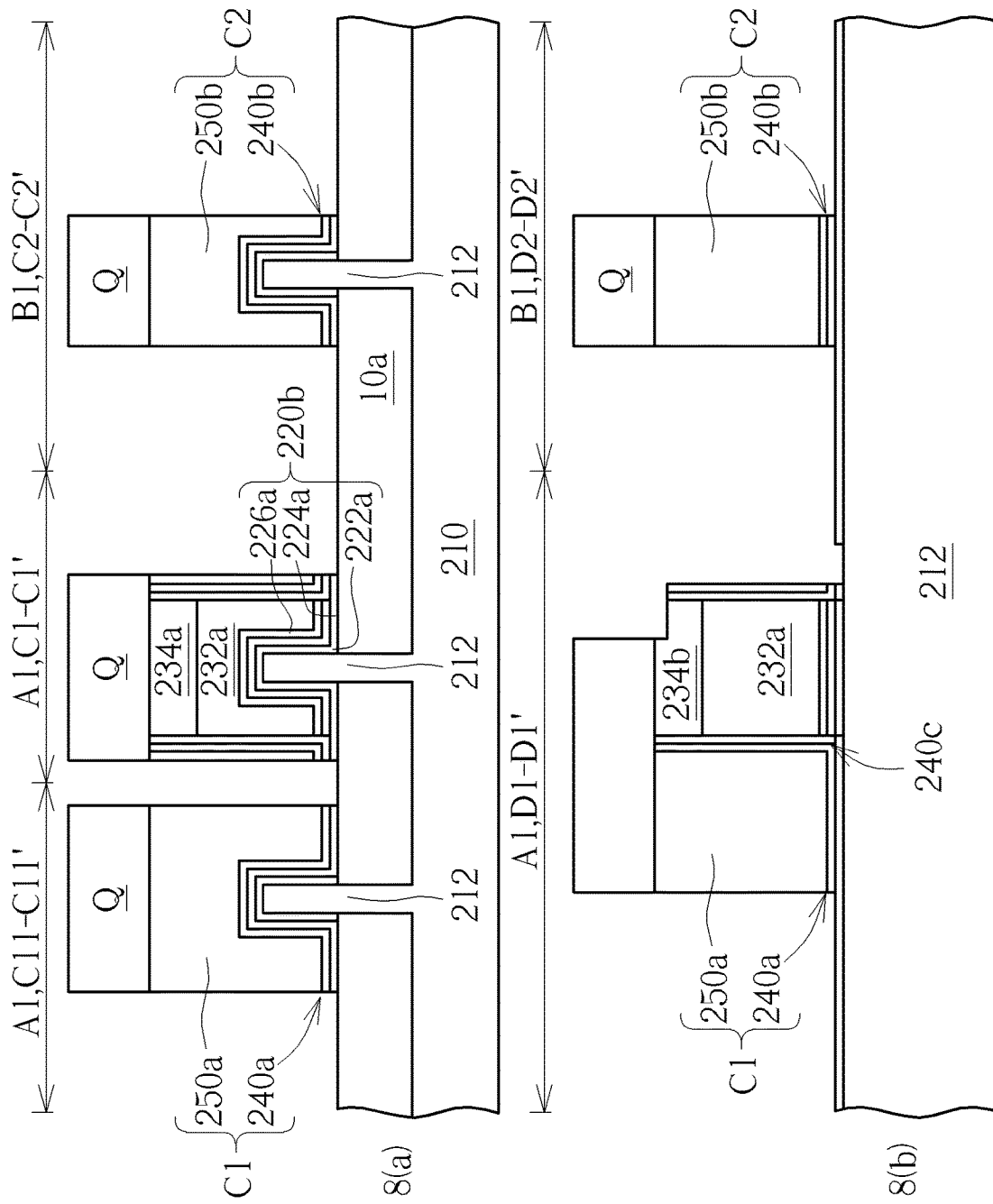
FIG. 8 schematically depicts a cross-sectional view of a method of forming a silicon-oxide-nitride-oxide-silicon (SONOS) memory cell for FinFET according to an embodiment of the present invention.

FIG. 8(a) are cross-sectional views along line C1C1' of FIG. 1, line C11C11' of FIG. 1, and line C2C2' of FIG. 1, and FIG. 8(b) are cross-sectional views along line D1D1' of FIG. 1 and line D2D2' of FIG. 1. Please refer to FIG. 7 to FIG. 8, the gate electrode layer 250 and the dielectric layer 240 are patterned to form a selective gate C1 in the memory region A1 adjacent to the control electrode 232a, and a gate C2 in the logic region B1. More precisely, as shown in FIG. 7, a patterned photoresist Q is formed to cover the gate electrode layer 250, and the gate electrode layer 250 and the dielectric layer 240 are patterned to form a selective gate electrode 250a and a gate oxide layer 240a in the memory region A1 adjacent to the control electrode 232a, and to form a gate electrode 250b and a gate oxide layer 240b in the logic region B1, as shown in FIG. 8. The selective gate electrode 250a and the gate oxide layer 240a constitute the selective gate C1, and the gate electrode 250b and the gate oxide layer 240b constitute the gate C2. Thereafter, the patterned photoresist Q is removed. Therefore, the selective gate C1 and the gate C2 are form at a same time. In this embodiment, a part of the hard mask 234a being exposed is removed while patterning the gate electrode layer 250 and the dielectric layer 240, to form a hard mask 234b.

Figure 9:
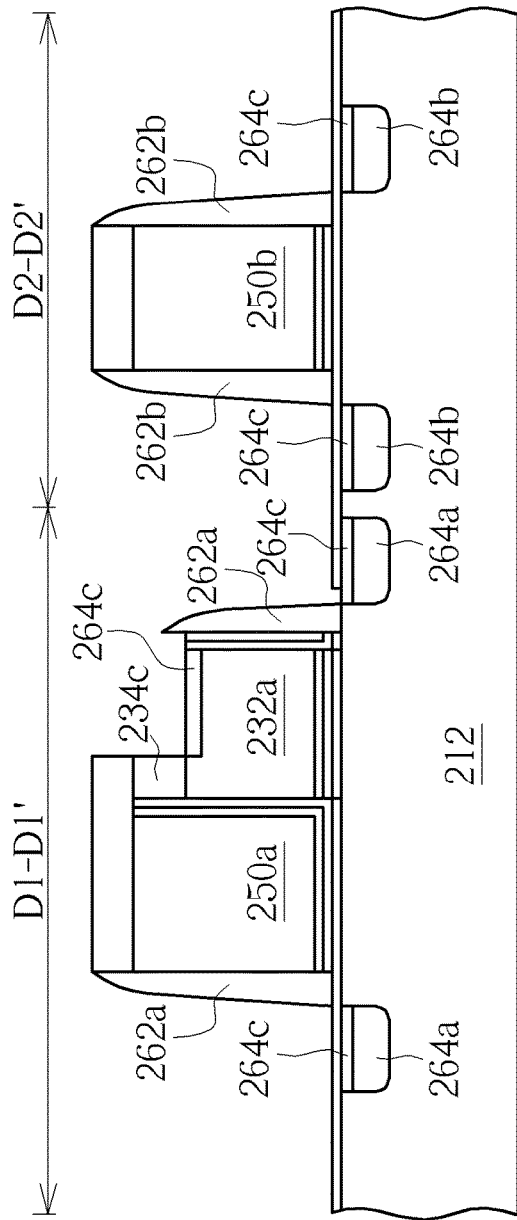
FIG. 9 schematically depicts a cross-sectional view of a method of forming a silicon-oxide-nitride-oxide-silicon (SONOS) memory cell for FinFET according to an embodiment of the present invention.

FIG. 9 are cross-sectional views along line D1D1' of FIG. 1 and line D2D2' of FIG. 1. As shown in FIG. 9, spacers 262a are formed on the substrate 210 beside the selective gate electrode 250a and the control electrode 232a, and spacers 262b are formed on the substrate 210 beside the gate electrode 250b simultaneously. Source/drain regions 264a/264b are formed in the fins 212 beside the selective gate 250a, the control gate 232a and the gate electrode 250b, and then the hard mask 234b above the control gate 232a is etched to expose a part of the control electrode 232a and remain a hard mask 234c. Thereafter, metal silicides 264c are formed on the source/drain regions 264a/264b and the control electrode 232a by forming metal and performing an annealing process.

Figure 10:
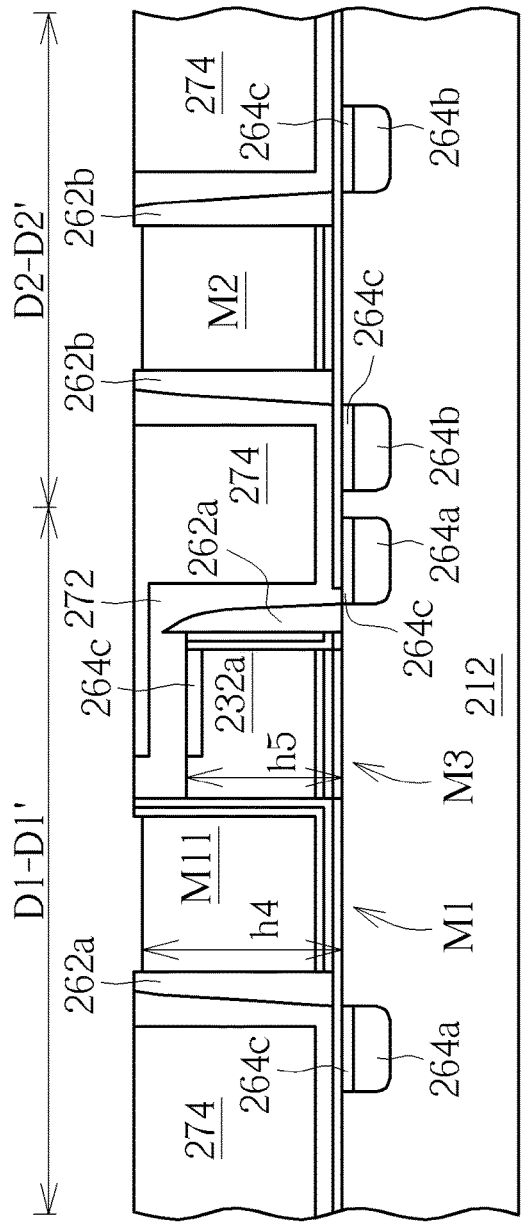
FIG. 10 schematically depicts a cross-sectional view of a method of forming a silicon-oxide-nitride-oxide-silicon (SONOS) memory cell for FinFET according to an embodiment of the present invention.

FIG. 10 are cross-sectional views along line D1D1' of FIG. 1 and line D2D2' of FIG. 1. As shown in FIG. 10, the selective gate electrode 250a and the gate electrode 250b are replaced by a selective metal gate electrode M11 and a metal gate M2 by performing a metal gate replacement process. More precisely, a depositing process and a planarization process are performed to form a contact etching stop layer 272 and an interlayer dielectric layer 274 on the substrate 210 beside the control electrode 232a, the selective gate electrode 250a and the gate electrode 250b; the selective gate electrode 250a and the gate electrode 250b are removed to form recesses (not shown); then, the selective metal gate electrode M11 and the metal gate M2 fill into the recesses. Thus, a height h4 of a selective metal gate M1 is higher than a height h5 of a control gate M3.

To summarize, the present invention provides a silicon-oxide-nitride-oxide-silicon (SONOS) memory cell for FinFET and forming method thereof. The method forms a fin on a substrate of a memory region and a logic region; sequentially deposits and patterns a charge trapping material and a control gate material covering the fin and the substrate blanketly, thereby forming a charge trapping layer and a control electrode; sequentially deposits and patterns a dielectric layer and a gate electrode layer covering the fin and the substrate blanketly, to form a gate in the logic region and a selective gate in the memory region adjacent to the control gate; and replaces the selective gate and the gate by a selective metal gate and a metal gate respectively. Hence, memory components and logic components can be formed on the fin at a same time, and memory processes integrate into logic processes. The control electrode of the present invention may include polysilicon, and the selective metal gate and the metal gate may include same materials.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a silicon-oxide-nitride-oxide-silicon (SONOS) memory cell for FinFET, comprising:
    forming a fin on a top surface of a substrate, wherein the fin comprises a memory region and a logic region;
    sequentially depositing a charge trapping material and a control gate material covering the fin and the substrate blanketly;
    patterning the control gate material and the charge trapping material to form a charge trapping layer and a control electrode over the fin of the memory region;
    sequentially depositing a dielectric layer and a gate electrode layer covering the fin and the substrate blanketly;
    patterning the gate electrode layer and the dielectric layer to form a gate in the logic region and a selective gate in the memory region adjacent to the control gate; and
    replacing the selective gate and the gate by a selective metal gate and a metal gate respectively.

2. The method of forming a silicon-oxide-nitride-oxide-silicon (SONOS) memory cell according to claim 1, wherein the fin has two sidewalls and a top surface.

3. The method of forming a silicon-oxide-nitride-oxide-silicon (SONOS) memory cell for FinFET according to claim 2, wherein the charge trapping layer and the control electrode cover the two sidewalls and the top surface of the fin.

4. The method of forming a silicon-oxide-nitride-oxide-silicon (SONOS) memory cell for FinFET according to claim 1, wherein the control electrode comprises polysilicon.

5. The method of forming a silicon-oxide-nitride-oxide-silicon (SONOS) memory cell for FinFET according to claim 1, wherein the charge trapping layer comprises an oxide-nitride-oxide (ONO) layer.

6. The method of forming a silicon-oxide-nitride-oxide-silicon (SONOS) memory cell for FinFET according to claim 1, wherein the control gate material and the charge trapping material are patterned by serving a bottom oxide layer of the charge trapping layer as an etching stop layer to form a pre-charge trapping layer and the control electrode.

7. The method of forming a silicon-oxide-nitride-oxide-silicon (SONOS) memory cell for FinFET according to claim 6, further comprising:
performing an oxide strip process to remove an exposed part of the bottom oxide layer and remain the charge trapping layer right below the control electrode.

8. The method of forming a silicon-oxide-nitride-oxide-silicon (SONOS) memory cell for FinFET according to claim 1, wherein steps of sequentially depositing the dielectric layer and the gate electrode layer comprise:
depositing a buffer layer and a high-k dielectric layer conformally covering the fin, the control electrode and the substrate; and
depositing the gate electrode layer on the high-k dielectric layer beside the control electrode.

9. The method of forming a silicon-oxide-nitride-oxide-silicon (SONOS) memory cell for FinFET according to claim 1, wherein the gate and the selective gate are formed at a same time.

10. The method of forming a silicon-oxide-nitride-oxide-silicon (SONOS) memory cell for FinFET according to claim 1, wherein the gate electrode layer and the dielectric layer are patterned to form the gate and the selective gate constituted by gate oxide layers and gate electrodes, and an insulator sandwiched by the selective gate and the control electrode.

11. The method of forming a silicon-oxide-nitride-oxide-silicon (SONOS) memory cell for FinFET according to claim 1, further comprising:
forming spacers on sidewalls of the selective gate, the control electrode and the gate after the gate and the selective gate are formed.

12. The method of forming a silicon-oxide-nitride-oxide-silicon (SONOS) memory cell for FinFET according to claim 1, further comprising:
forming source/drain regions in the fin beside the selective gate, the control electrode and the gate; and
forming metal silicide on the source/drain regions and the control electrode.

* * * * *